United States Patent [19]

Naruse et al.

[11] Patent Number: 5,670,293

[45] Date of Patent: Sep. 23, 1997

[54] LEAD-FRAME FORMING MATERIAL

[75] Inventors: Yasuhito Naruse; Kiyoshi Kamitani; Akio Uesugi; Tsutomu Kakei, all of Shizuoka; Gouichi Morohoshi, Tokyo, all of Japan

[73] Assignee: Fuji Photo Film Co., Ltd., Kanagawa, Japan

[21] Appl. No.: 402,000

[22] Filed: Mar. 10, 1995

[30] Foreign Application Priority Data

Mar. 10, 1994 [JP] Japan ................................. 6-065444

[51] Int. Cl.⁶ .............................. G03F 7/09; G03F 7/095
[52] U.S. Cl. .................. 430/165; 430/275.1; 430/277.1; 427/289; 427/327
[58] Field of Search ........................ 430/165, 275, 430/277, 275.1, 277.1; 156/630; 427/289, 327

[56] References Cited

U.S. PATENT DOCUMENTS

| | | |
|---|---|---|
| 4,342,151 | 8/1982 | Guild . |
| 5,098,814 | 3/1992 | Tunney et al. ........................ 430/275 |

FOREIGN PATENT DOCUMENTS

| | | |
|---|---|---|
| 0249834 | 12/1987 | European Pat. Off. . |
| 0325545 | 7/1989 | European Pat. Off. . |
| 0492952 | 7/1992 | European Pat. Off. . |
| 0617332A1 | 9/1994 | European Pat. Off. . |
| 2706901 | 8/1977 | Germany . |
| 62-154766 | 7/1987 | Japan . |
| 63-279256 | 11/1988 | Japan . |
| 2000866 | 1/1990 | Japan . |
| 2213847 | 8/1990 | Japan . |
| 4204656 | 7/1992 | Japan . |

OTHER PUBLICATIONS

Guild, "Blank and Process for the Formation of Beam Leads for IC Chip Bonding", *Research Disclosure*, Disclosure No. 18570, *185(1)*:523–526 (Sep., 1979).

An, "A Light–Sensitive Material Having a Matting Layer", *Research Disclosure*, Disclosure No. 18055, *180(0)*:161 (Apr., 1979).

*Primary Examiner*—Christopher G. Young
*Attorney, Agent, or Firm*—Sughrue, Mion, Zinn, Macpeak & Seas

[57] ABSTRACT

Disclosed are a positive type lead-frame forming material which contains a light-sensitive material comprising an o-quinonediazide compound and a novolak resin, and a positive type lead-frame forming material which contains a positive resist composition comprising (1) a water-insoluble but alkaline water-soluble resin, (2) a compound capable of generating an acid by irradiation with active rays or radiant rays, and (3) a compound containing a group decomposable by acid which can increase its solubility in an alkaline developer through the action of the acid.

4 Claims, No Drawings

LEAD-FRAME FORMING MATERIAL

FIELD OF THE INVENTION

The present invention relates to a lead-frame forming material and, more particularly, to the constitution of a positive lead-frame forming material.

BACKGROUND OF THE INVENTION

A lead-frame is a metal frame forming an extension line lead terminal with a die pad which is used for fixing a semiconductor pellet used in a plastic mold IC and a ceramics package IC. There is used for the metal frame, a lead-frame forming metal plate made of alloy mainly containing copper or copper-nickel as a material. In recent years, an element of an active metal series such as titanium and chromium has been added to the material as well. In any event, it is desired that the material used have good mechanical strength, high electric conductivity, high softening temperature, a coefficient of thermal expansion matching the coefficient of thermal expansion of a semiconductor pellet and a package material, secured flatness of a lead, small bending anisotropy, good heat releasing performance, and a low cost. A pattern is formed on the lead-forming metal plate by punching out or by etching with an etching solution. The punching out method can be carried out at a low cost and a precise pattern can be formed by the etching method.

In recent years, development in semiconductor and integrated circuit manufacturing accompanied with an increased demand for electronic parts using lead-frames has resulted in an increased requirement for providing lead-frame having uniform quality in large volume.

In manufacturing lead-frames, there has been used in the past, for example, an alloy plate mainly containing copper or an alloy plate mainly containing copper-nickel, and in order to remove rust preventives applied on the alloy plate, the alloy plate was subjected to a degrease treatment and an acid cleaning treatment. Then, a light-sensitive layer of a dry type film which is generally a negative type, is deposited or a liquid resist which is generally a negative type was coated, and dried on the plate to provide a light-sensitive material layer. After the light-sensitive layer was exposed through a prescribed etching pattern, it was then subjected to a developing treatment and any exposed parts of the light-sensitive layer were removed. Then, the alloy plate was dipped in an etching solution to form a prescribed etching pattern on the alloy plate surface.

For producing pattern-formed lead-frames having uniform quality in large volume by the use of a conventional lead-frame forming material as described above, a great many sheets of lead-frame forming materials have been prepared so far in the following manner: A great many sheets of metallic substrate, e.g., a great number of alloy plates as described above, are subjected to successive degreasing and acid cleaning treatments one after another in a batch treatment, thereby removing rust preventives coated on each sheet of the alloy plate, and each sheet of the thus treated alloy plate is coated with a light-sensitive material of a dry type which is generally a negative type by adhesion or deposition, or coated with a liquid resist which is generally a negative type by a coating method such as spin coating, each followed by drying, to provide a light-sensitive layer on the alloy plate.

The above-described conventional manners for preparing lead-frame forming materials have many problems as described below.

1. In the case of using a dry film, the preparation process is complicated. More specifically, the process comprises laminating a film on both surfaces of a resist, peeling off the film on one surface, adhering the bare surface of the resist to an alloy plate made of, e.g., copper, imagewise exposing the resist to light through the film on the other surface, peeling off the film on the resist surface, and developing the resist. In this process, the resist is frequently contaminated with dust upon adhesion of the dry film, thereby reducing to the yield.

2. In the case of using a liquid resist, on the other hand, it is required that the resist be applied to both surfaces of every sheet of the plate by means of a rotary coating device such as spinner, thereby markedly deteriorating the productivity with an extremely great loss of the liquid resist, and further involving another serious problem of easy sticking of dust.

3. After the degreasing and acid cleaning treatments as described above, a dry type film is adhered or deposited on both surfaces of the plate, and then the laminate is exposed to light with a mask film being placed on both the upper and lower surfaces thereof. If once fine dust is stuck on the dry film to be contacted with the mask film, it is not easy to eliminate the fine dust from the dry film.

4. Almost all the conventional lead-frame forming materials are a negative type, whether they use a dry film or liquid resist, and it is very rare for known materials of a positive type to be successful in practical use. In general, a lead-frame is constituted of a central part on which IC or the like is mounted and a part of filaments which extend from the central part in the form of strips. In the use case of using a negative light-sensitive material, the clear part (transparent part) is used as filaments of a copper plate and a mask on the central part; that is, parts which must be remained after development of the resist. If the exposure is carried out while sticking fine dust on the clear part, light cannot strike on the part which must be originally exposed to light. Thus, in the worst case, disconnection in the circuit may be caused in the final product.

5. In cases of using a conventional dry film and liquid resist, the resist which is removed by development with a developer cannot be completely dissolved in the developer, but is partly released in the form of film. In some cases, there is a fear such that the resulting scum may reattach to the material to make it a rejected article.

6. When a lead-frame forming material to which a conventional dry film or liquid resist has been adhered is allowed to stand for more than 3 or 4 days, the adhesion power becomes so strong that incomplete removal of the resist occurs, thereby making it impossible to form accurate patterns.

7. Another problem arises when the etching pattern as described above is exposed to light. More specifically, a pattern formed mask film is placed on a lead-frame forming material on which a light-sensitive layer has been provided, and brought into close contact therewith. The close contact between the mask and the lead-frame forming material can be accomplished by various methods. For example, it can be squeezed by a roller on the mask film. Alternatively, the lead-frame forming material on which a mask film has been placed is set in a frame and then evacuated to remove the air between the mask film and the lead-frame forming material. Thus, it is tried to prevent a printing image from undercutting during exposure. However, in the roller squeezing method, it is hard to remove the air present between the mask film and the forming material. On the other hand, the evacuation method is disadvantageous in that it takes much time to remove the air from the central part because the air removal begins with the circumferential part, in the worst case, the air cannot be removed from the central part.

In addition, the following new problems arise in the course of application of the material of the present invention. That is, even when the light-sensitive materials as described above are used, it sometimes happens that impairments such as scratches, pressed marks and the like are newly generated in various steps including conveying, developing and etching steps. Further, the generation of pinholes and microscopic film peeling of the resist occasionally occur in the developing and etching steps.

SUMMARY OF THE INVENTION

The present invention has been worked out to eliminate the above-described disadvantages. Thus, a lead-frame forming material has the following features:

In accordance with a first embodiment of the present invention, it is provided with a lead-frame forming material which is prepared by coating a light-sensitive material on both surfaces of a metal web made of copper, a copper alloy or a nickel alloy, drying the coated layer, and winding it into a roll or cutting off at every fixed length and stacking thereof, wherein the light-sensitive material comprises an o-quinonediazide compound and a novolak resin.

In accordance with a second embodiment of the present invention, it is provided with a lead-frame forming material which is prepared by coating a light-sensitive material on both surfaces of a metal web made of copper, a copper alloy or a nickel alloy, drying the coated layer, and winding it into a roll or cutting off at every fixed length and stacking thereof, wherein the light-sensitive material is a positive resist composition which comprises:

(1) a water-insoluble but alkaline water-soluble resin, (2) a compound capable of generating an acid by irradiation with active rays or radiant rays, and (3) a compound containing a group decomposable by acid which can increase its solubility in an alkaline developer through the action of the acid.

In accordance with a third embodiment of the present invention, it is provided with a lead-frame forming material as described in the first or second embodiment, wherein the light-sensitive material further contains a water-insoluble but alkaline water-soluble high molecular weight compound containing a —SO2—NH— bond in its side or main chain.

In accordance with a fourth embodiment of the present invention, it is provided with a lead-frame forming material as described in the first or second embodiment, wherein protrusions having a height of from 0.5 µm to 30 µm are provided on the surface of the light-sensitive layer.

In accordance with a fifth embodiment of the present invention, it is provided with a lead-frame forming material as described in the first or second embodiment, wherein fine roughness of from 0.05 µm to 1 µm is provided on the surface of the metal plate made of copper, a copper alloy or a nickel alloy.

DETAILED DESCRIPTION OF THE INVENTION

A lead-frame forming material of the present invention is prepared by a process which comprises subjecting a lead-frame forming metal web to degreasing and acid cleaning in sequence, coating a light-sensitive composition of the present invention on both surfaces of the treated metal plate web, followed by drying to form a light-sensitive layer, and then cutting the coated lead-frame metal web in fixed lengths or winding it into a roll.

According to the above-described process, the working process can be simplified to a great extent, compared with the process using a conventional dry film or liquid resist. Further, the problem of dust attachment caused by adhesion of a dry film or the excessive loss of a liquid resist caused when it is applied every sheet can be avoided.

The continuous winding operation or the stacking after cutting operation can be accomplished only with the light-sensitive material of the present invention. It can be accomplished by no means with the resist material which constitutes the conventional dry film or liquid resist such as casein, because of its adhesion trouble.

Further, in the case of using a conventional dry film, photopolymerizable light-sensitive materials are used in most cases, because adhesiveness to a substrate, such as a copper plate, and elasticity are required of those light-sensitive materials. Accordingly, development must be of a peeling type. Further, the adhesiveness increases with the lapse of time. Thus, the light-sensitive materials after lamination have a short life time. In contrast, the light-sensitive materials used in the present invention are not photopolymerizable ones but a solution development type, and they show no excessive increase in adhesiveness with the lapse of time because of their less interaction with the substrate.

As a result of further examination on various light-sensitive materials, it has been found that the foregoing two types of positive resist compositions enabled the formation of precise images and had strong resistance to an etching solution such as ferric chloride, and so they can provide satisfactory lead-frames when they were coated on a metal plate made of, e.g., copper.

While dry films and liquid resists which have so far been used in practice work negatively upon image formation and have drawbacks as described above, the light-sensitive materials used in the present invention can make it possible to prevent the generation of imperfections arising from dust, scratches and the like and to heighten the resolution.

Formation of protrusions on the coat (light-sensitive layer), as described above, ensures the prevention of adhesion between light-sensitive layers, even if these layers are more or less adhesive, when they are brought into contact with each other by winding the light-sensitive material coated on both surfaces of a metallic substrate, such as a copper plate, a copper alloy plate, etc., into a roll or by cutting it off at every fixed length into sheets and then stacking each sheet upon another. Further, when a mask film or original is placed on the coat of light-sensitive material and set in a frame, the protrusions on the coat can form a definite narrow gap between the mask film or original and the lead-frame forming material, thereby making it possible to remove the air throughout, from the circumferential part to the central part, in a short period of time.

The height of protrusions on the coat of the light-sensitive layer is within the range of 0.5 to 30 µm, preferably 1 to 15 µm, and more preferably 3 to 12 µm.

If the protrusions have a height lower than 0.5 µm, their effect upon adhesion and evacuation is too small no matter how may such protrusions are provided; while if their height is above 30 µm, the exposure via the mask film tends to cause undercutting of a printing image because of too great distance between the mask film and the coat.

Further, prior to the lead-frame formation, since the light-sensitive material coated on a substrate made of copper, a copper alloy or the like is wound into a roll or it is cut off at every fixed length into sheets and each sheet is stacked upon another sheet, impairments such as scratches, pressed marks or the like are sometimes generated at the surface of the light-sensitive material in the winding step or the conveying step after cutting. In addition, impairments such as scratches are occasionally generated in the exposure, development and etching steps. In order to solve the impairment problem as described above, it is effective to further incorporate in the light-sensitive material a water-insoluble but alkaline water-soluble high molecular weight compound which contains —SO2—NH— bonds in its side chains or main chain, as described hereinbefore.

Furthermore, even when the light-sensitive material as described above is used, the coat thereof is occasionally poor in adhesiveness to the substrate, which may cause troubles in development, etching or other steps. In this case, it is extremely effective to finely roughen the surface of a metallic substrate made of copper, a copper alloy or the like. It is desirable that the fine roughness of the substrate surface be in the range of 0.03 to 1 µm, preferably 0.06 to 0.8 µm, and more preferably 0.1 to 0.6 µm.

Methods which can be adopted in forming protrusions on the light-sensitive layer and in finely roughening the surface of a metallic substrate are illustrated hereinafter.

Now, the light-sensitive materials used in the present invention will be further described below.

(1) The first embodiment of the present invention is a lead-frame forming material which comprises a light-sensitive material containing an o-quinonediazide compound and a novolak resin.

In the light-sensitive material, for instance, there are used an o-naphthoquinonediazidosulfonic acid ester as the o-quinonediazide compound and a novolak resin derived from a phenol-cresol mixture.

More specifically, suitable examples of an o-quinonediazide compound include o-naphthoquinonediazide compounds as described, e.g., in U.S. Pat. Nos. 2,766,118, 2,767,092, 2,772,972, 2,859,112, 3,102,809, 3,106,465, 3,635,709 and 3,647,443, and other various publications.

Of those compounds, o-naphthoquinonediazidosulfonic acid esters of an aromatic hydroxy compound or o-naphthoquinonediazidocarboxylic acid esters of an aromatic hydroxy compound, and o-naphthoquinonediazidosulfonic acid amides of an aromatic amine compound or o-naphthoquinonediazidocarboxylic acid amides of an aromatic amine compound are preferred over the others. Especially excellent among them are the product of esterification reaction between a pyrogallol-acetone condensate and o-naphthoquinonediazidosulfonic acid, as disclosed in U.S. Pat. No. 3,635,709; the product of esterification reaction between a polyester having a hydroxy group at a terminal and o-naphthoquinonediazidosulfonic acid or o-naphthoquinonediazidocarboxylic acid, as disclosed in U.S. Pat. No. 4,028,111; the product of esterification reaction between a homopolymer of p-hydroxystyrene or a copolymer with the other monomers copolymerizable therewith and o-naphthoquinonediazidosulfonic acid or o-naphthoquinonediazidocarboxylic acid, as disclosed in U.K. Patent 1,494,043; and the product of amide reaction between a copolymer of p-aminostyrene with the other copolymerizable monomers and o-naphthoquinonediazidosulfonic acid or o-naphthoquinonediazidocarboxylic acid, as disclosed in U.S. Pat. No. 3,759,711.

These o-quinonediazide compounds, though they can be used singly, are preferably used as a mixture with an alkaline-soluble resin. A favorable alkaline-soluble resin is a novolak type phenol resin, with specific examples including phenol-formaldehyde resin, o-cresol-formaldehyde resin and m-cresol-formaldehyde resin. When the phenol resins as cited above are used in combination with a condensate of formaldehyde and a phenol or cresol substituted with an alkyl group containing 3 to 8 carbon atoms, such as t-butylphenol-formaldehyde resin, more favorable effect can be provided.

In order to form a visible image upon exposure, there is further added o-naphthoquinonediazido-4-sulfonyl chloride, an inorganic anion salt of p-diazodiphenylamine, a trihalomethyloxadiazole compound, a benzofuran ring-containing trihalomethyloxadiazole compound or the like compounds. As a coloring agent for an image, on the other hand, a triphenylmethane dye such as Victoria Blue BOH, Crystal Violet, Oil Blue or the like is used. In particular, the dyes disclosed in JP-A-62-293247 (the term "JP-A" as used herein means an "unexamined published Japanese patent application") are particularly preferred.

Furthermore, the nonionic surfactants as disclosed in JP-A-62-251740 can be incorporated in the light-sensitive material for the purpose of improving developing properties.

The composition as described above is dissolved in a solvent which can dissolve all the ingredients illustrated above, and applied to both surfaces of a substrate. Specific examples of the solvent which can be used herein include, for example, ethylene dichloride, cyclohexanone, methyl ethyl ketone, ethylene glycol monomethyl ether, ethylene glycol monoethyl ether, 2-methoxyethylacetate, 1-methoxy-2-propanol, 1-methoxy-2-propylacetate, methyl lactate, ethyl lactate, dimethyl sulfoxide, dimethylacetamide, dimethylformamide, water, N-methylpyrrolidone, tetrahydrofurfuryl alcohol, acetone, diacetone alcohol, methanol, ethanol, isopropanol, diethylene glycol dimethyl ether. These solvents are used alone or in admixture.

The light-sensitive composition containing the ingredients as illustrated above is applied in an amount of from 0.5 to 100 g/m², preferably from 0.8 to 10.0 g/m², and more preferably from 1.0 to 8.0 g/m², in terms of solid matter.

(2) The second embodiment of the present invention is a lead-frame forming material which comprises the following light-sensitive composition, that is, the positive resist composition constituted of:

(a) a water-insoluble but alkaline-soluble resin, (b) a compound capable of generating an acid by irradiation with active rays or radiant rays, and (c) a compound containing a group decomposable by acid which can increase its solubility in an alkaline developer through the action of the acid.

Specific examples of such a composition include, e.g., those containing respectively the combinations of a compound capable of generating an acid by photodecomposition with acetal or an O,N-acetal compound (JP-A-48-89003), an ortho ester or amidoacetal compound (JP-A-51-120714), a polymer containing acetal or ketal linkages in the main chain (JP-A-53-133429), an enol ether compound (JP-A-55-12995), an N-acyliminocarbonate compound (JP-A-55-126236), a polymer containing orthoester linkages in the main chain (JP-A-56-17345), a tertiary alkyl ester compound (JP-A-60-3625), a silyl ester compound (JP-A-60-10247), and a silyl ether compound (JP-A-60-37549, JP-A-60-121446). The quantum yields of these combinations are greater than 1 in principle, and so they can exhibit high sensitivity.

Similarly to the above, the combinations of esters containing a tertiary or secondary carbon (e.g., t-butyl ester, 2-cyclohexenyl ester) or carbonic acid ester compounds with compounds capable of generating an acid upon exposure, as described, e.g., in JP-A-59-45439, JP-A-60-3625, JP-A-62-229242, JP-A-63-27829, JP-A-63-36240, JP-A-63-250642, Polym. Eng. Sce., volume 23, page 1012 (1983), ACS. Sym., volume 242, page 11 (1984), Semiconductor World, November issue, page 91 (1987), Macromolecules, volume 21, page 1475 (1988), and SPIE, volume 920, page 42 (1988) can be instanced as systems of the kind which are stable upon standing at room temperature but decomposed by heating in the presence of an acid to solubilize in an alkali. These systems also have high sensitivity, and their absorption in Deep UV region is weak, compared with the absorption of a naphthoquinone-diazide-novolak resin system in that region. Therefore, they can be effective systems to shift the wavelengths of a light source to shorter ones. The above-described chemical amplification type positive resists can be largely divided into two groups, that is, one group consisting of three-component systems constituted of an alkali-soluble resin, a compound capable of generating an acid by exposure to radiant rays (photoacid generator) and an acid decomposable group-containing compound which can retard the dissolution of the alkali-soluble resin and the other group consisting of two-component systems constituted of a resin containing a group which is decomposed by the reaction with an acid to become soluble in an alkali and a photoacid generator.

The compounds of the kind which can generate an acid by irradiation with active rays or radiant rays (radiation) are added in an amount of generally from 0.001 to 40 wt %, preferably from 0.01 to 20 wt % and more preferably from 0.1 to 5 wt %, based on the total weight of the light-sensitive composition (exclusive of the solvent used for coating).

The light-sensitive composition of the present invention can further contain a dye, a pigment, a plasticizer, a surfactant, a photosensitizer and a compound containing at least two phenolic OH groups which can promote the dissolution in a developer, if needed.

As for the dye, oily dyes and basic dyes are suitably used. Specific examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (which all are the products of Orient Chemical Industry Co., Ltd.), Crystal Violet (CI42555), Methyl Violet (CI43535), Rhodamine B (CI45170B), Malachite Green (CI42000), Methylene Blue (CI52015) and so on.

Further, spectral sensitizers as described below can be added in order to sensitize the composition in the wavelength region longer than far ultraviolet wherein the photoacid generator used has no absorption. Suitable examples of such a spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzyl, Acridine Orange, benzoflavin, cetoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, spectral sensitizers usable in the present invention should not be construed as being limited to those cited above.

The light-sensitive composition of the present invention is dissolved in a solvent capable of dissolving all the ingredients described above, then coated on a support. Suitable examples of a solvent used herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. These solvents are used alone or in admixture thereof.

To the above-cited solvents, a surfactant can also be added. Specific examples of such a surfactant include nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc.; polyoxyethylene alkylaryl ethers, e.g., polyoxyethylene octylphenyl ether, polyoxyethylene nonylphenyl ether, etc.; polyoxyethylene-polyoxypropylene block copolymers; sorbitan fatty acid esters, e.g., sorbitan monolaurate, sorbitan monopalmitate, sorbitan monostearate, sorbitan monooleate, sorbitan trioleate, sorbitan tristearate, etc.; polyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine-containing surfactants such as EFTOP EF301, EFTOP EF303 and EFTOP EF352 (trade names, products of Shin-Akita Kasei Co., Ltd.), Megafac F171 and Megafac F173 (trade names, products of Dainippon Ink & Chemicals Inc.), Florade FC430 and Florade FC431 (trade names, products of Sumitomo 3M Co., Ltd.), Asahi Guard AG710, Surflon S-382, SC101, SC102, SC103, SC104, SC105 and SC106 (trade names, products of Asahi Glass Company Ltd.); organosiloxane polymer KP341 (products of Shin-Etsu Chemical Industry Co., Ltd.); and acrylic or methacrylic (co)polymers Polyflow No. 75 and No. 95 (products of Kyoeisha Oil and Fat Chemical Ind. Co., Ltd.). The amount of a surfactant added is generally at most 2 parts by weight, preferably at most 1 part by weight, per 100 parts by weight of the solid matter in the present composition.

The surfactants as cited above may be added alone or some of them can be added in combination.

The light-sensitive composition constituted of the ingredients as described above is applied in an amount of 0.5 to 100 g/m², preferably 0.8 to 10.0 g/m², and more preferably 1.0 to 8.0 g/m², in terms of solid matter.

Further, as described above, it is effective to add a high molecular weight compound as illustrated below in the case where it brings about a problem to suffer impairments such as scratches during development step or in the etching step subsequent thereto, or in the course of winding and conveying operations.

The water-insoluble but alkaline water-soluble high molecular weight compound containing a sulfonamido group used in the present invention is preferably a high molecular weight compound containing —$SO_2$—NH— bonds in side chains or main chain, and more preferably a high molecular weight compound containing —$SO_2$—NH— in side chains.

The sulfonamido group-containing water-insoluble but aqueous alkali-soluble high molecular weight compound used in the present invention can be obtained by polymerizing a low molecular weight compound, which contains at least one sulfonamido group having at least one hydrogen atom on its N atom as well as at least one polymerizable unsaturated bond, in a proper solvent in the presence of a known polymerization initiator.

Examples of such a low molecular weight compound, which can be used to a greater advantage in the present invention, include those represented by the following general formula (I), (II), (III) and (IV), respectively:

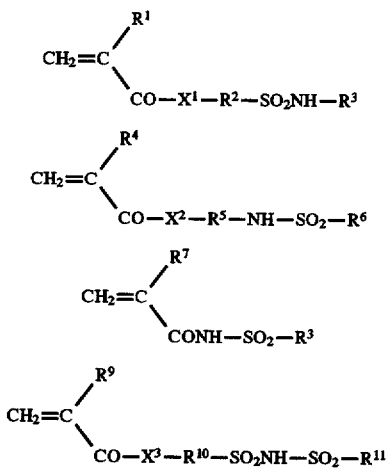

In the above formula, $X^1$, $X^2$ and $X^3$ each represent —O— or —$NR^{12}$—; $R^1$, $R^4$, $R^7$ and $R^9$ each represent —H or —$CH_3$; $R^2$, $R^5$ and $R^{10}$ each represent a $C_1$-$C_{12}$ alkylene, cycloalkylene, arylene or aralkylene group, which each may have a substituent; $R^3$ represents —H, or a $C_1$-$C_{12}$ alkyl, cycloalkyl, aryl or aralkyl group, which each may have a substituent; $R^6$, $R^8$ and $R^{11}$ each represent a $C_1$-$C_{12}$ alkyl, cycloalkyl, aryl or aralkyl group, which each may have a substituent; and $R^{12}$ represents —H, or a $C_1$-$C_{12}$ alkyl, cycloalkyl, aryl or aralkyl group, which each may have a substitutent.

Of the low molecular weight compounds represented by the foregoing general formula (I), (II), (III) and (IV), those preferred in particular in the present invention include the compounds containing as $R^2$, $R^5$ and $R^{10}$ each a $C_2$-$C_6$ alkylene or cycloalkylene group or a unsubstituted or substituted phenylene or naphthylene group, as $R^3$ —H, a $C_1$-$C_6$ alkyl group or cycloalkyl group or a unsubstituted or substituted phenyl or naphthyl group, as $R^6$, $R^8$ and $R^{11}$ each a $C_1$-$C_6$ alkyl or cycloalkyl group or a unsubstituted or substituted phenyl or naphthyl group, and as $R^{12}$ hydrogen.

Specific examples of low molecular weight compounds represented by general formula (I) and (II) respectively include, e.g., methacrylamides such as N-(o-aminosulfonylphenyl)methacrylamide, N-(m-aminosulfonylphenyl)methacrylamide, N-(p-aminosulfonylphenyl)methacrylamide, N-(o-methylaminosulfonylphenyl)methacrylamide, N-(m-methylaminosulfonylphenyl)methacrylamide, N-(p-methylaminosulfonylphenyl)methacrylamide, N-(o-ethylaminosulfonylphenyl)methacrylamide, N-(m-ethylaminosulfonylphenyl)methacrylamide, N-(p-ethylaminosulfonylphenyl)methacrylamide, N-(o-n-propylaminosulfonylphenyl)methacrylamide, N-(m-n-propylaminosulfonylphenyl)methacrylamide, N-(p-n-propylaminosulfonylphenyl)methacrylamide, N-(o-i-propylaminosulfonylphenyl)methacrylamide, N-(m-i-propylaminosulfonylphenyl)methacrylamide, N-(p-i-propylaminosulfonylphenyl)methacrylamide, N-(o-n-butylaminosulfonylphenyl)methacrylamide, N-(m-n-butylaminosulfonylphenyl)methacrylamide, N-(p-n-butylaminosulfonylphenyl)methacrylamide, N-(o-i-butylaminosulfonylphenyl)methacrylamide, N-(m-i-butylaminosulfonylphenyl)methacrylamide, N-(p-i-butylaminosulfonylphenyl)methacrylamide, N-(o-sec-butylaminosulfonylphenyl)methacrylamide, N-(m-sec-butylaminosulfonylphenyl)methacrylamide, N-(p-sec-butylaminosulfonylphenyl)methacrylamide, N-(o-t-butylaminosulfonylphenyl)methacrylamide, N-(m-t-butylaminosulfonylphenyl)methacrylamide, N-(p-t-butylaminosulfonylphenyl)methacrylamide, N-(o-phenylaminosulfonylphenyl)methacrylamide, N-(m-phenylaminosulfonylphenyl)methacrylamide, N-(p-phenylaminosulfonylphenyl)methacrylamide, N-(o-(α-naphthylaminosulfonyl)phenyl)methacrylamide, N-(m-(α-naphthylaminosulfonyl)phenyl)methacrylamide, N-(p-(α-naphthylaminosulfonyl)phenyl)methacrylamide, N-(o-(β-naphthylaminosulfonyl)phenyl)methacrylamide, N-(m-(β-naphthylaminosulfonyl)phenyl)methacrylamide, N-(p-(β-naphthylaminosulfonyl)phenyl)methacrylamide, N-(1-(3-aminosulfonyl)naphthyl)methacrylamide, N-(1-(3-methylaminosulfonyl)naphthyl)methacrylamide, N-(1-(3-ethylaminosulfonyl)naphthyl)methacrylamide, N-(o-methylsulfonylaminophenyl)methacrylamide, N-(m-methylsulfonylaminophenyl)methacrylamide, N-(p-methylsulfonylaminophenyl)methacrylamide, N-(o-ethylsulfonylaminophenyl)methacrylamide, N-(m-ethylsulfonylaminophenyl)methacrylamide, N-(p-ethylsulfonylaminophenyl)methacrylamide, N-(o-phenylsulfonylaminophenyl)methacrylamide N-(m-phenylsulfonylaminophenyl)methacrylamide N-(p-phenylsulfonylaminophenyl)methacrylamide, N-(o-(p-methylphenylsulfonylamino)phenyl)methacrylamide, N-(m-(p-methylphenylsulfonylamino)phenyl)methacrylamide, N-(p-(p-methylphenylsulfonylamino)phenyl)methacrylamide, N-(p-(α-naphthylsulfonylamino)phenyl)methacrylamide, N-(p-(β-naphthylsulfonylamino)phenyl)methacrylamide, N-(2-methylsulfonylaminoethyl)methacrylamide, N-(2-ethylsulfonylaminoethyl)methacrylamide, N-(2-phenylsulfonylaminoethyl)methacrylamide, N-(2-p-methylphenylsulfonylaminoethyl)methacrylamide, N-(2-α-naphthylsulfonylaminoethyl)methacrylamide, N-(2-β-naphthylsulfonylaminoethyl)methacrylamide, etc.; acrylamides containing the same substituent groups as the above-cited methacrylamides have; methacrylic acid esters such as o-aminosulfonylphenyl methacrylate, m-aminosulfonylphenyl methacrylate, p-aminosulfonylphenyl methacrylate, o-methylaminosulfonylphenyl methacrylate, m-methylaminosulfonylphenyl methacrylate, p-methylaminosulfonylphenyl methacrylate, o-ethylaminosulfonylphenyl methacrylate, m-ethylaminosulfonylphenyl methacrylate, p-ethylaminosulfonylphenyl methacrylate, o-n-propylaminosulfonylphenyl methacrylate, m-n-propylaminosulfonylphenyl methacrylate, p-n-propylaminosulfonylphenyl methacrylate, o-i-propylaminosulfonylphenyl methacrylate, m-i-propylaminosulfonylphenyl methacrylate, o-n-butylaminosulfonylphenyl methacrylate, m-n-butylaminosulfonylphenyl methacrylate, p-n-butylaminosulfonylphenyl methacrylate, m-i-butylaminosulfonylphenyl methacrylate, p-i-butylaminosulfonylphenyl methacrylate, m-sec-butylaminosulfonylphenyl methacrylate, p-sec-butylaminosulfonylphenyl methacrylate, m-t-butylaminosulfonylphenyl methacrylate, p-t-butylaminosulfonylphenyl methacrylate, o-phenylaminosulfonylphenyl methacrylate, m-phenylaminosulfonylphenyl methacrylate, p-phenylaminosulfonylphenyl methacrylate, m-(α-naphthylaminosulfonyl)phenyl methacrylate, p-(α-naphthylaminosulfonyl)phenyl methacrylate, m-(β-naphthylaminosulfonyl)phenyl methacrylate, p-(β-naphthylaminosulfonyl)phenyl methacrylate, 1-(3-aminosulfonyl)naphthyl methacrylate, 1-(3-methylaminosulfonyl)naphthyl methacrylate, 1-(3-ethylaminosulfonyl)naphthyl methacrylate, o-methylsulfonylaminophenyl methacrylate, m-methylsulfonylaminophenyl methacrylate, p-methylsulfonylaminophenyl methacrylate, o-ethylsulfonylaminophenyl methacrylate, m-ethylsulfonylaminophenyl methacrylate, p-ethylsulfonylaminophenyl methacrylate, o-phenylsulfonylaminophenyl methacrylate, m-phenylsulfonylaminophenyl methacrylate, p-phenylsulfonylaminophenyl methacrylate, o-(p-methylphenylsulfonylamino)phenyl methacrylate, m-(p-methylphenylsulfonylamino)phenyl methacrylate, p-(p-methylphenylsulfonylamino)phenyl methacrylate, p-(α-naphthylsulfonylamino)phenyl methacrylate, p-(β-naphthylsulfonylamino)phenyl methacrylate, 2-methylsulfonylaminoethyl methacrylate, 2-ethylsulfonylaminoethyl methacrylate, 2-phenylsulfonylaminoethyl methacrylate, 2-p-methylsulfonylaminoethyl methacrylate, 2-α-naphthylsulfonylaminoethyl methacrylate, 2-β-naphthylsulfonylaminoethyl methacrylate, etc.; and acrylates containing the same substituent groups as the above-cited methacrylates have.

Specific examples of a low molecular weight compounds represented by general formula (III) include, e.g., N-methacrylbenzenesulfonamide, N-methacryl p-toluenesulfonamide, N-methacryl m-toluenesulfonamide, N-methacryl p-methoxyphenylsulfonamide, N-methacryl p-butoxyphenylsulfonamide, N-methacryl p-methoxyphenylsulfonamide, N-methacryl α-naphthylsulfomamide, N-methacryl o-butoxyphenylsulfonamide, N-acryl benzenesulfonamide, N-acryl p-toluenesulfonamide, N-acryl o-toluenesulfonamide, N-acryl o-methoxyphenylsulfonamide, N-acryl p-i-amylphenylsulfonamide, N-acryl o-methoxyphenylsulfonamide, N-acryl α-naphthylsulfonamide, and N-acryl m-butoxyphenylsulfonamide.

Specific examples of a low molecular compound represented by general formula (IV) include, e.g., methacrylamides such as N-(p-(p-methylphenylsulfonylamino) sulfonylphenyl)methacrylamide, N-(p-(phenylsulfonylamino) sulfonylphenyl)methacrylamide, N-(m-(p-methoxyphenyl-sulfonylamino)sulfonylphenyl) methacrylamide, N-(o-(o-methoxyphenylsulfonylamino) sulfonylphenyl)methacrylamide, N-(p-(p-i-butylphenylsulfonylamino)sulfonylphenyl) methacrylamide, N-(p-(α-naphthylsulfonylamino) sulfonylphenyl) methacrylamide, N-(p-(β-naphthylsulfonylamino) sulfonylphenyl)methacrylamide, etc.; acrylamides containing the same substituent groups as the above-cited methacrylamides have; methacrylic acid esters such as p-(p-methylphenylsulfonylamino) sulfonylphenyl methacrylate, m-(phenylsulfonylamino) sulfonylphenyl methacrylate, p-(p-methoxyphenylsulfonylamino)sulfonylphenyl methacrylate, p-(α-naphthylsulfonylamino)sulfonylphenyl methacrylate, o-(p-methylphenylsulfonylamino)sulfonylphenyl methacrylate, p-(m-i-butylphenylsulfonylamino) sulfonylphenyl methacrylate, P-(β-naphthylsulfonylamino) sulfonylphenyl methacrylate, etc.; and acrylic acid esters containing the same substituent groups as the above-cited methacrylic acid esters have.

Other low molecular weight compounds containing a sulfonamido group and a polymerizable unsaturated bond which can be used to greater advantage in the present invention are those represented by the following general formulae (V) to (VII):

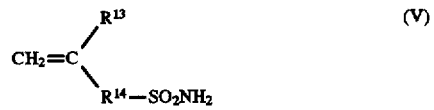

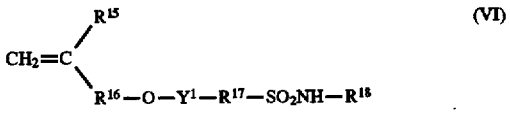

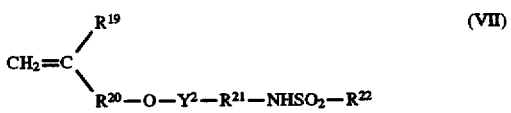

In the above formulae, $R^{13}$, $R^{15}$ and $R^{19}$ each represent a hydrogen atom, a halogen atom or a methyl group, preferably a hydrogen atom.

$R^{14}$ represents an optionally substituted $C_1$–$C_{12}$ alkylene, cycloalkylene, arylene or aralkylene group, preferably an optionally substituted methylene, phenylene or naphthylene group.

$R^{16}$ and $R^{20}$ each represent a single bond, or an optionally substituted $C_1$–$C_{12}$ alkylene, cycloalkylene, arylene or aralkylene group, preferably a single bond or a methylene group.

$R^{17}$ and $R^{21}$ each represent an optionally substituted $C_1$–$C_{12}$ alkylene, cycloalkylene, arylene or aralkylene group, preferably a $C_1$–$C_6$ alkylene group or an optionally substituted phenylene or naphthylene group.

$R^{18}$ represents a hydrogen atom, or an optionally substituted $C_1$–$C_{12}$ alkyl, cycloalkyl, aryl or aralkyl group, preferably a hydrogen atom, a $C_1$–$C_6$ alkyl or cycloalkyl group or an optionally substituted phenyl or naphthyl group.

$R^{22}$ represents an optionally substituted $C_1$–$C_{12}$ alkyl, cycloalkyl, aryl or aralkyl group, preferably a $C_1$–$C_6$ alkyl or cycloalkyl group or an optionally substituted phenyl or naphthyl group.

$Y^1$ and $Y^2$ each represent a single bond or —C(=O)—.

Specific examples of compounds represented by the foregoing general formulae (V) to (VII) include, e.g., p-aminosulfonylstyrene, p-aminosulfonyl-α-methylstyrene, p-aminosulfonylphenyl allyl ether, p-(N-methylaminosulfonyl) phenyl allyl ether, vinyl methylsulfonylaminoacetate, vinyl phenylsulfonylaminoacetate, allyl methylsulfonylaminoacetate, allyl phenylsulfonylaminoacetate, and p-methylsulfonylaminophenyl allyl ether.

Sulfonamido group-containing high molecular weight compounds which are suitably used in the present invention may be homopolymers of the low molecular weight compounds as recited above, wherein at least one hydrogen atom is attached to the N atom and a polymerizable unsaturated bond is contained, or copolymers containing two or more thereof. Preferably, the sulfonamido group-containing high molecular weight compounds are copolymers containing as constituent monomers the low molecular weight compound of the foregoing type and at least one compound of the type which contains at least one polymerizable unsaturated bond but does not contain any sulfonamido group.

Such compounds as to contain at least one polymerizable unsaturated bond but not to contain any sulfonamido group are the compounds which contain a polymerizable unsaturated compound chosen from among, e.g., acrylic acid, methacrylic acid, acrylic acid esters, acrylamides, methacrylic acid esters, methacrylamides, allyl compounds, vinyl ethers, vinyl esters, styrenes, crotonic acid esters and the like. Specific examples thereof include, e.g., acrylic acid esters, such as alkyl (preferably $C_1$–$C_{10}$ alkyl) acrylates (e.g., methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate) and aryl acrylates (e.g., phenyl acrylate); methacrylic acid esters, such as alkyl (preferably $C_1$–$C_{10}$ alkyl) methacrylates (e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethylhydroxypropyl methacrylate, trimethylolpropane monomethacrylate, pentaerythritol monomethacrylate, glycidyl methacrylate, furfuryl methacrylate, tetrahydrofurfuryl methacrylate), aryl methacrylates (e.g., phenyl methacrylate, cresyl methacrylate, naphthyl methacrylate) and the like; acrylamides, such as acrylamide, N-alkylacrylamides (the alkyl moieties of which are those containing 1 to 10 carbon atoms, e.g., methyl, ethyl, propyl, butyl, t-butyl, heptyl, octyl, cyclohexyl, benzyl, hydroxyethyl), N-arylacrylamides (the aryl moieties of which are, e.g., phenyl, tolyl, nitrophenyl, naphthyl, hydroxyphenyl), N,N-dialkylacrylamides (the alkyl moieties of which are those containing 1 to 10 carbon atoms, e.g., methyl, ethyl, butyl, isobutyl, ethylhexyl, cyclohexyl), N,N-arylacrylamides (the aryl moieties of which are phenyl and the like), N-methyl-N-phenylacrylamide, N-hydroxyethyl-N-methylacrylamide, N-2-acetamidoethyl-N-acetylacrylamide and the like; methacrylamides, such as methacrylamide, N-alkylmethacrylamides (the alkyl moieties of which are those containing 1 to 10 carbon atoms, e.g., methyl, ethyl, t-butyl, ethylhexyl, hydroxyethyl, cyclohexyl), N-arylmethacrylamides (the aryl moieties of which are phenyl and the like), N,N-dialkylmethacrylamides (the alkyl moieties of which are, e.g., ethyl, propyl, butyl), N,N-diarylmethacrylamides (the aryl moieties of which are phenyl and the like), N-hydroxyethyl-N-methylmethacrylamide, N-methyl-N-phenylmethacrylamide, N-ethyl-N-phenylmethacrylamide and the like; allyl compounds, such as allyl esters (e.g., allyl acetate, allyl caproate, allyl caprylate, allyl laurate, allyl palmitate, allyl stearate, allyl benzoate, allyl acetoacetate, allyl lactate), allyloxyethanol and so on; vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether), vinyl aryl ethers (e.g., vinyl phenyl ether, vinyl tolyl ether, vinyl chlorophenyl ether, vinyl 2,4-dichlorophenyl ether, vinyl naphthyl ether, vinyl anthranyl ether) and so on; vinyl esters, such as vinyl butyrate, vinyl isobutyrate, vinyl trimethylacetate, vinyl diethylacetate, vinyl valeate, vinyl caproate, vinyl chloroacetate, vinyl dichloroacetate, vinyl methoxyacetate, vinyl butoxyacetate, vinyl phenylacetate, vinyl acetoacetate, vinyl lactate, vinyl β-phenylbutyrate, vinyl cyclohexylcarboxylate, vinyl benzoate, vinyl salicylate, vinyl chlorobenzoate, vinyl tetrachlorobenzoate, vinyl naphthoate and the like; styrenes, such as styrene, alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene), alkoxystyrenes (e.g., methoxystyrene, 4-methoxy-3-methylstyrene, dimethoxystyrene), halogonostyrenes (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene) and so on; crotonic acid esters, such as alkylcrotonates (e.g., butyl crotonate, hexyl crotonate, glycerine monocrotonate); dialkyl itaconates (e.g., dimethyl itaconate, diethyl itaconate, dibutyl itaconate); dialkyl esters of maleic or fumaric acid (e.g., dimethyl maleate, dibutyl fumarate); and acrylonitrile and methacrylonitrile.

Of the polymerizable unsaturated bond-containing compounds as cited above, methacrylic acid esters, acrylic acid esters, methacrylamides, acrylamides, acrylonitrile, methacrylonitrile, methacrylic acid and acrylic acid are preferred over the others.

The copolymers containing as constituent monomers at least one polymerizable unsaturated bond-containing compound as cited above and at least one compound containing a sulfonamido group and a polymerizable unsaturated bond may be any of, e.g., block, random and graft copolymers.

In these copolymers, it is desirable that the sulfonamido group-containing constituent units be present in a proportion of at least 5 mol%, preferably from 10 to 90 mol %, to the whole constituent units.

Specific examples of an organic solvent use in synthesizing those high molecular weight compounds include, e.g., ethylene dichloride, cyclohexanone, methyl ethyl ketone, acetone, methanol, ethanol, ethylene glycol monomethyl ether, ethylene glycol monoethyl ether, 2-methoxyethylacetate, 1-methoxy-2-propanol, 1-methoxy-2-propylacetate, N,N-dimethylformamide, N,N-dimethylacetamide, dimethyl sulfoxide, toluene, ethyl acetate, methyl lactate, ethyl lactate.

These solvents may be used alone or in admixture of two or more thereof.

In addition to the above-cited copolymers, polyurethane resins are suitable as the sulfonamido group-containing high molecular weight compounds which are insoluble in water but soluble in an aqueous alkaline solution.

Polyurethane resins which can be used to advantage in the present invention are the polyurethane resins containing as their basic skeletons the reaction products of diisocyanate compounds and diol compounds containing a sulfonamido group which has at least one hydrogen atom attached to the N atom.

Specific examples of a diisocyanate compound which can be preferably used in the present invention include, e.g., aromatic diisocyanate compounds, such as 2,4- tolylenediisocyanate, 2,4-tolylenediisocyanate dimer, 2,6-tolylenediisocyanate, p-xylylenediisocyanate, m-xylylenediisocyanate, 4,4'-diphenylmethanediisocyanate, 1,5-naphthylenediisocyanate, 3,3'-dimethylbiphenyl-4,4'-diisocyanate, etc.; aliphatic diisocyanate compounds, such as hexamethylene diisocyanate, trimethylhexamethylene diisocyanate, lysine diisocyanate, dimer acid diisocyanate, etc.; alicyclic diisocyanate compounds, such as isophorone diisocyanate, 4,4'-methylenebis(cyclohexylisocyanate), methylcyclohexane-2,4 (or 2, 6) -diisocyanate, 1,3-(isocyanatomethyl)cyclohexane, etc.; and reaction products of diols and diisocyanates, such as the adduct of 1 mole of 1,3-butylene glycol and 2 moles of tolylenediisocyanate.

As for the diol compound containing a sulfonamido group which has at least one hydrogen atom attached to the N atom, the following compounds are examples thereof.

That is, there can be instanced, e.g., p-(1,1-dihydroxymethylethylcarbonylamino)benzenesulfonamide, N-ethyl-p-(1,1-dihydroxymethylethylcarbonylamino) benzenesulfonamide, N-(m-methylsulfonylaminophenyl)-2,2-dihydroxymethylpropanamide, N-(p-methylsulfonylaminophenyl)-2,2-dihydroxymethylpropanamide, N-(m-ethylsulfonylaminophenyl)-2,2-dihydroxymethylpropanamide, N-(p-ethylsulfonylaminophenyl)-2,2-hydroxymethylpropanamide, N-(2,2-(dihydroxyethylaminocarbonyl)ethyl)methanesulfonamide, N-(2,2-(dihydroxyethylaminocarbonyl)ethyl)benzenesulfonamide, N-(2,2-(dihydroxyethylaminocarbonyl)ethyl)p-toluenesulfonamide.

These sulfonamido group-containing diol compounds can be used alone or in admixture of two or more thereof.

Further, they may be used in combination with other sulfonamido-free diol compounds which may have a substituent incapable of reacting with isocyanate.

Specific examples of such a diol compound include, e.g., ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinonedihydroxyethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate, bis(2-hydroxyethyl)isophthalate, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid and tartaric acid. The polyurethane resins used in the present invention can be synthesized by dissolving the foregoing diisocyanate compounds and diol compounds in aprotic solvents and then heating them in the presence of known catalysts having activities matching the reactivities of the compounds used. In the synthesis, a suitable ratio between the diisocyanate compound and the diol compound is in the range of 0.8:1 to 1.2:1 by mole. If a terminal isocyanate group remains in the polymer synthesized, it is treated with an alcohol or an amine. Thus, no isocyanate group remains in the polyurethane resins as the final product.

As for the molecular weight of the present high molecular weight compounds, it is desirable that they have a weight average molecular weight of at least 2,000 and a number average molecular weight of at least 1,000. Preferably, their weight average molecular weight ranges from 5,000 to 300,000 and their number average molecular weight from 2,000 to 250,000. The distribution coefficient of their molecular weight (the ratio of a weight average molecular weight to a number average molecular weight) is desirably not smaller than 1, preferably in the range of 1.1 to 10.

In addition, the high molecular weight compounds used in the present invention may contain unreacted monomers. In this case, it is to be desired that the proportion of such monomers to the high molecular weight compounds be at most 15 wt %.

The content of such high molecular weight compounds in the light-sensitive composition ranges from about 5 to about 95 wt %, preferably from about 10 to about 85 wt %, and more preferably from 15 to 80 wt %.

In both the aforementioned first and second embodiments of the present invention, it is desirable that protrusions having a height of 0.5 to 30 μm be formed on the coat surface of the light-sensitive layer.

Such protrusions can be formed on the coated surface of the light-sensitive layer by various methods. For instance, there can be cited a method of applying a dispersion of a proper fine particle powder in an appropriate resin or polymer solution to the coat of the light-sensitive layer.

Specific examples of the fine particle materials include, e.g., polyethylene particles, polypropylene particles, ethylene-propylene copolymer particles, crosslinked vinyl polymer particles. The crosslinked vinyl polymer particles can be obtained by a well-known suspension polymerization method. Specifically, these particles are prepared as follows: A hydrophobic vinyl monomer containing one vinyl group (e.g., an acrylic acid ester, a methacrylic acid ester, styrene, a styrene derivative, acrylonitrile) and a polyfunctional monomer in a proportion of 1 to 30 parts by weight to the foregoing vinyl monomer (e.g., divinylbenzene, polyethylene glycol diacrylate (number of ethylene units (n)=1–14), polyethylene glycol dimethacrylate (number of ethylene units (n)=1–14), trimethylolpropane triacrylate, trimethylolpropane trimethacrylate, pentaerythritol triacrylate, pentaerythritol trimethacrylate, pentaerythritol tetramethacrylate) are added to an aqueous medium in which there is dissolved a conventional dispersing agent for suspension polymerization (e.g., an inorganic powder such as zinc oxide, calcium carbonate, talc, etc., water-soluble high molecular weight compound such as gelatin, polyvinyl alcohol, etc.); and the resulting mixture is degassed with nitrogen, heated up to a temperature of about 50° to 80° C. with stirring, and admixed with a conventional oil-soluble polymerization initiator (e.g., benzoyl peroxide, azobisisobutyronitrile) to undergo the polymerization reaction over a period of about 2 to 20 hours, thereby preparing the dispersion of the crosslinked vinyl polymer particles. This dispersion is then subjected to solid-liquid separation and subsequent drying operations. Thus, the crosslinked vinyl polymer particles are obtained.

As for the high molecular weight compound used in a liquid for dispersing the above-cited fine particle materials, the compounds containing hydroxy, amino, carboxyl, amido, sulfonamido, active methylene, thioalcohol, epoxy and the like groups are preferred. Specific examples of a high molecular weight compound preferred as binder include, e.g., Shellac as disclosed in U.K. Patent 1,350,521, the polymers containing hydroxyethyl acrylate or hydroxyethyl methacrylate units as main constitutional repeating units as disclosed in U.K. Patent 1,460,978 and U.S. Pat. No. 4,123,276, the polyamide resin as disclosed in U.S. Pat. No. 3,751,257, the phenol resin as disclosed in U.K. Patent 1,074,392, the linear polyurethane resin as disclosed in U.S. Pat. No. 3,660,097, the epoxy resin obtained by the condensation reaction between bisphenol A and epichlorohydrin, amino group-containing polymers such as polyaminostyrenes and polyalkylamino(meth)acrylates, and celluloses such as acetyl cellulose, cellulose alkyl ethers, cellulose acetate phthalate.

Various solvents can be suitably used for preparing the dispersion. For example, the suitable solvent can be chosen from among 2-methoxyethanol, 2-ethoxyethanol, 2-methoxyethylacetate, 2-ethoxyethylacetate, dimethylformamide, a methanol-dichloroethylene mixture and mixtures of two or more thereof. As for the methanol-dichloroethylene mixture cited above, the methanol may be replaced by ethanol, n-propanol, isopropanol or a mixture thereof, and the dichloroethylene also may be replaced by methyl chloride, trichloroethane, monochlorobenzene or a mixture thereof. Further, those solvents may additionally mixed with other solvents unless any adverse effects are provided thereby. Specific examples as for the additional solvent include, e.g., ketones such as acetone, methyl ethyl ketone, methyl isobutyl ketone, etc., esters such as methyl acetate, ethyl acetate, n-propyl acetate, isopropyl acetate, n-butyl acetate, methylamyl acetate, etc.

The solutions of resins or the like in those solvents, which are used for dispersing the fine particle material, have generally a concentration of about 0.1 to about 30 wt %, and preferably a concentration of 1 to 10 wt %.

However, the method of forming protrusions measuring 0.5 to 30 μm in height on the coated surface of a light-sensitive layer which can be adopted herein should not be construed as being limited to the above-described one.

As for the substrate used for forming a lead-frame as described above, it is desirable to use a thin plate or web made of an alloy which contains copper or copper-nickel as a main component or an alloy prepared by further adding an active metal element such as titanium, chromium or so on to the main component as cited above.

As for the chemicals usable in the degreasing treatment, acids and alkalis can be used. Specific examples thereof include, e.g., sodium carbonate, phosphoric acid, sulfuric acid, hydrochloric acid, nitric acid, sodium hydroxide, sodium metasilicate, sodium disilicate, sodium hexametaphosphate, sodium secondary phosphate, sodium tripolyphosphate, sodium pyrophosphate and the like. It is desirable to carry out the degreasing treatment under a condition such that a degreasing agent as cited above is used in the form of water solution having a concentration of 0.01 to 50% and the temperature and the time for the treatment are adjusted to the ranges of 20° to 90° C. and 5 seconds to 5 minutes, respectively.

Further, the degreasing treatment of a metallic plate web for forming the lead-frame under the foregoing condition may be carried out in combination with an electrochemical method.

Furthermore, for the purpose of improvement on the adhesion of a substrate made of, e.g., copper, a copper alloy or the like in both the first and second embodiments of the present invention, as described hereinbefore, it is extremely effective to finely roughen (or to provide fine roughness on) the surface of the substrate made of, e.g., copper, a copper alloy or the like. As for the roughening method used for the foregoing purpose, it is general to adopt mechanical methods, such as a ball graining method, a blast graining method, a brush rubbing method in which an aqueous dispersion slurry of abrasive, e.g., pumice, is rubbed in the substrate surface by means of a nylon brush, and so on. When the roughening treatment is carried out using such a mechanical method, smut is generated. In order to remove the smut generated, therefore, the toughened surface is treated with phosphoric acid, nitric acid, sulfuric acid, chromic acid, a mixture thereof, or the like.

Now, the present invention will be illustrated in more detail by reference to the following non-limiting examples. Unless otherwise indicated, all ratios, percents, etc. are by weight.

EXAMPLE 1

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, followed by winding it into a roll in a length of 2,000 m.

Light-sensitive Solution Composition:

| | |
|---|---|
| Ester compound prepared from naphthoquinone-1,2-diazido-5-sulfonyl chloride and pyrogallol-acetate resin | 0.9 g |
| Cresol-formaldehyde resin | 2.0 g |
| Naphthoquinone-1,2-diazido-4-sulfonic acid chloride | 0.03 g |
| "Oil Blue #603" (trade name) | 0.02 g |
| Methyl ethyl ketone | 8 g |
| 2-Methoxyethylacetate | 15 g |

The thus wound roll was cut off at every length of 500 mm, and 1,000 sheets of Samples $A_1$ to $A_{1000}$ were prepared.

Each of these Samples $A_1$ to $A_{1000}$ was used as the lead-frame forming metal plate. An etching pattern image forming film original plate was brought into contact with the light-sensitive layer of each Sample, and the light-sensitive layer was exposed to light and developed to remove the unexposed part thereof. Thereafter, the lead-frame forming metal plate was dipped in an etching solution of ferric chloride, and the etched part was removed therefrom. Thus, 1,000 sheets of a desired lead-frame were prepared.

Comparative Example 1

The light-sensitive solution described below was prepared, and coated on a 25 μm-thick polyethylene terephthalate film base in a dry thickness of about 50 μm by means of a rod coater, followed by 5 minutes' drying in a 100° C. oven, making a light-sensitive film.

Light-sensitive Solution Composition:

| | |
|---|---|
| Methylmethacrylate | 40.5 g |
| Methacrylic acid | 4.5 g |
| 2,4-Dimethylthioxanthone | 0.3 g |
| Ethyl p-dimethylaminobenzoate | 0.33 g |
| Tribromomethylphenylsulfone | 0.4 g |
| Trimethylolpropane triacrylate | 3.0 g |
| Trimethylolpropane diacrylate | 5.0 g |
| Tetramethylene glycol diacrylate | 2.0 g |
| Leuco Methyl Violet | 0.08 g |

-continued

| | |
|---|---|
| 1-Phenyl-3-morpholinomethyl-1,3,4-triazole-2-thione | 0.09 g |
| Victoria Pure Blue BOH | 0.01 g |
| Methyl cellosolve | 10 g |

The same copper alloy web as used in Example 1 was subjected to the same degreasing and subsequent washing treatments as in Example 1, and covered on both surfaces with the foregoing light-sensitive film by means of a laminator, Model A24 (made by DuPont) at 120° C. so that the light-sensitive layer came into contact with the copper surface. The resulting laminate was cut off at every length of 500 mm, and thereby were prepared 1,000 sheets of Samples $B_1$ to $B_{1000}$.

Then, an etching pattern image forming film original plate was brought into contact with each Sample, and the light-sensitive coat was exposed to light and developed to remove the unexposed part thereof. Thereafter, the lead-frame forming metal plate was dipped in an etching solution of ferric chloride, and the etched part was removed therefrom. Thus, 1,000 sheets of a desired lead-frame were prepared.

The comparison between Samples $A_1$ to $A_{1000}$ prepared in Example 1 and Samples $B_1$ to $B_{1000}$ prepared in Comparative Example 1 showed that only two sheets of rejected articles were found among Samples $A_1$ to $A_{1000}$, while 83 sheets of rejected articles were found among Samples $B_1$ to $B_{1000}$, which were itemized as follows.

35 sheets: dust attached during lamination 23 sheets: dust attached during exposure 18 sheets: resist reattached after peeled off during development 7 sheets: other reasons In addition, the time required to prepare Samples $A_1$ to $A_{1000}$ was 2 hours, while the time required to prepare Samples $B_1$ to $B_{1000}$ was 17 hours.

EXAMPLE 2

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was, treated with 10% sulfuric acid at a temperature of 60° C. for 20 seconds and washed with water. The following light-sensitive solution was coated thereon and dried, and further coated with a coating solution containing a fine particle material (an overcoat solution) and dried, followed by winding it into a roll in a length of 2,000 m.

Light-sensitive Solution Composition:

| | |
|---|---|
| Ester compound prepared from naphthoquinone-1,2-diazido-5-sulfonyl chloride and pyrogallol-acetate resin | 0.9 g |
| Cresol-formaldehyde resin | 2.0 g |
| Naphthoquinone-1,2-diazido-4-sulfonic acid chloride | 0.03 g |
| "Oil Blue #603" (trade name) | 0.02 g |
| Methyl ethyl ketone | 8 g |

Overcoat Solution Composition:

| | |
|---|---|
| 2-Hydroxyethyl methacrylate copolymer | 0.3 g |
| Urea-formaldehyde resin (average particle size: 10 μm) | 0.025 g |
| Methanol | 6 g |
| 2-Methoxyethanol | 6 g |

The coverage of the coating composition was 4 g/m$^2$ and that of the overcoat solution was 0.3 g/m$^2$.

The foregoing wound roll was stored for 20 days in a room regulated at a temperature of 40°–45° C. and a humidity of 60–70%, and then cut off at every length of 500 mm to prepare 3,900 sheets of plates. All of these plates were free from adhesion troubles on both surfaces.

An etching pattern image forming film original plate was placed on one of the lead-frame forming plates obtained above, and evacuated to bring them into contact with each other.

This operation was repeated five times using 5 sheets of plates separately. As shown in Table 1, the contact operation was completed throughout the plate in 25.6 seconds on average, and the images formed on these plates were not undercut by exposure.

TABLE 1

| Plate No. | Time required for complete contact |
|---|---|
| 1 | 25 sec. |
| 2 | 27 sec. |
| 3 | 23 sec. |
| 4 | 29 sec. |
| 5 | 24 sec. |
| on average | 25.6 sec. |

Comparative Example 2

A light-sensitive material having the following composition was coated on the same copper alloy web as in Example 2 at a dry coverage of 5 g/m$^2$, and dried, followed by winding it into a roll. After winding it into a roll in a length of 50 m, the roll was immediately unwound. As a result, adhesion mark was observed over at least 80% of the whole area.

Light-sensitive Solution Composition:

| | |
|---|---|
| Methyl methacrylate/methacrylic acid/2-ethylhexyl methacrylate/benzyl methacrylate copolymer (molar ratio: 55/28/12/5, weight average molecular weight: 80,000, 35 wt % solution, solvent: 2/1 mixture of methyl ethyl ketone with 1-methoxy-2-propanol) | 100.0 parts |
| Dodecapropylene glycol diacrylate | 15.0 parts |
| Tetraethylene glycol dimethacrylate | 3.5 parts |
| p-Toluenesulfonamide | 1.2 parts |
| 4,4'-Bis(diethylamino)benzophenone | 0.12 part |
| Benzophenone | 2.3 parts |
| 2-(2'-chlorophenyl)-4,5-diphenylimidazole dimer (25 wt % dichloromethane solution) | 4.5 parts |
| Tribromomethylphenylsulfone | 0.25 part |
| Leuco Crystal Violet | 0.25 part |
| Malachite Green | 0.02 part |

Comparative Example 3

A roll of copper alloy web having the same size and the same composition as in Example 2 was subjected to the surface treatment under the same condition as in Example 2, coated with the same light-sensitive solution as in Example 2 and dried (without coating the overcoat solution), then wound it into a roll in a length of 2,000 m.

Thereafter, the roll was stored for 20 days under the same condition as in Example 2, and then cut into sheets having a length of 500 mm. Slight adhesion was observed on the upper part of the initial sheet, while it was observed that the 500th sheet had adhesion marks on both surfaces covering at least 30% of the plate area.

On the other hand, the same film original as used in Example 1 was placed on each of five samples prepared by cutting into sheets having a length of 500 mm without winding it into a roll after the coating operation, and evacuated to bring them into contact with each other. The time required of each sample for close contact is shown in Table 2.

TABLE 2

| Sample No. | Time required for close contact |
|---|---|
| 1 | 63 sec. |
| 2 | 68 sec. |
| 3 | 72 sec. |
| 4 | 86 sec. |
| 5 | 75 sec. |
| on average | 72.8 sec. |

In addition, there was observed an indication in the central part that the air was not completely evacuated.

EXAMPLE 3

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, followed by winding it into a roll in a length of 2,000 m.
Light-sensitive Solution Composition:

| | |
|---|---|
| Ester compound prepared from naphthoquinone-1,2-diazido-5-sulfonyl chloride and pyrogallol-acetate resin | 0.9 g |
| Cresol-formaldehyde resin | 2.0 g |
| Naphthoquinone-1,2-diazido-4-sulfonic acid chloride | 0.03 g |
| "Oil Blue #603" (trade name) | 0.02 g |
| Methyl ethyl ketone | 8 g |
| 2-Methoxyethylacetate | 15 g |
| N-(p-Aminosulfonylphenyl)methacrylamide | 0.6 g |

The thus wound roll was cut off at every length of 500 mm, and 1,000 sheets of Samples $A_1$ to $A_{1000}$ were prepared.

Comparative Example 4

The same copper alloy web roll as used in Example 3 was treated under the same condition as in Example 3, coated with the following light-sensitive solution in a length of 2,000 m, dried and wound it into a roll in the length of 2,000 m.
Light-sensitive Solution Composition:

| | |
|---|---|
| Ester compound prepared from naphthoquinone-1,2-diazido-5-sulfonyl chloride and pyrogallol-acetate resin | 0.9 g |
| Cresol-formaldehyde resin | 2.0 g |
| Naphthoquinone-1,2-diazido-4-sulfonic acid chloride | 0.03 g |
| "Oil Blue #603" (trade name) | 0.02 g |
| Methyl ethyl ketone | 8 g |
| 2-Methoxyethylacetate | 15 g |

The wound roll as described above was cut off at every length of 500 mm, and thereby were prepared 1,000 sheets of Samples $B_1$ to $B_{1000}$.

The Samples $A_1$ to $A_{1000}$ prepared in Example 3 and the Samples prepared in Comparative Example 4 were observed for the frequency of occurrence of scratches and press marks on the plate surface.

As for the Samples $A_1$ to $A_{1000}$, the generation of scratches was observed in two sheets, and the generation of press marks in one sheet.

As for the Samples $B_1$ to $B_{1000}$, on the other hand, the generation of scratches was observed in 15 sheets, and the generation of press marks in 5 sheets.

Thus, the newly added binder has proved to be effective in reduction of impairments.

EXAMPLE 4

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. Then, the surface thereof was grained using a nylon brush and a 400 mesh pumice-water suspension, and washed thoroughly with water. In order to remove the smut generated thereon, the surface was neutralized with 20% nitric acid solution, and rinsed, thereby preparing a substrate. The thus obtained substrate was coated with the following light-sensitive solution, dried, and then wound it into a roll in a length of 2,000 m.
Light-sensitive Solution Composition:

| | |
|---|---|
| Ester compound prepared from naphthoquinone-1,2-diazido-5-sulfonyl chloride and pyrogallol-acetate resin | 0.9 g |
| Cresol-formaldehyde resin | 2.0 g |
| Naphthoquinone-1,2-diazido-4-sulfonic acid chloride | 0.03 g |
| "Oil Blue #603" (trade name) | 0.02 g |
| Methyl ethyl ketone | 8 g |
| 2-Methoxyethylacetate | 15 g |

The thus wound roll was cut off at every length of 500 mm, and 1,000 sheets of Samples $A_1$ to $A_{1000}$ were prepared.

Each of these Samples $A_1$ to $A_{1000}$ was used as the lead-frame forming metal plate. An etching pattern image forming film original plate was brought into contact with the light-sensitive layer of each Sample, and the light-sensitive layer was exposed to light and developed to remove the unexposed part thereof. Thereafter, the lead-frame forming metal plate was dipped in an etching solution of ferric chloride, and the etched part was removed therefrom. Thus, 1,000 sheets of a desired lead-frame were prepared.

Comparative Example 5

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. The following light-sensitive solution was coated thereon and dried, followed by winding it into a roll in a length of 2,000 m.
Light-sensitive Solution Composition:

| | |
|---|---|
| Ester compound prepared from naphthoquinone-1,2-diazido-5-sulfonyl chloride and pyrogallol-acetate resin | 0.9 g |
| Cresol-formaldehyde resin | 2.0 g |
| Naphthoquinone-1,2-diazido-4-sulfonic acid chloride | 0.03 g |
| "Oil Blue #603" (trade name) | 0.02 g |
| Methyl ethyl ketone | 8 g |
| 2-Methoxyethylacetate | 15 g |

The thus wound roll was cut off at every length of 500 mm, and 1,000 sheets of Samples $B_1$ to $B_{1000}$ were prepared.

The thus obtained Samples $B_1$ to $B_{1000}$ were processed in the same manner as in Example 4 to prepare 1,000 sheets of a desired lead-frame.

1,000 sheets of lead-frames prepared in Example 4 and 1,000 sheets of lead-frames prepared in Comparative Example 5 were observed for the numbers of microscopic film peelings and pinholes generated in the coat. The result is shown below.

|  | Film Peeling | Pinhole |
| --- | --- | --- |
| $A_1 - A_{1000}$ | 2 | 5 |
| $B_1 - B_{1000}$ | 10 | 68 |

Thus, effects produced by fine roughness on the substrate surface were observed clearly.

EXAMPLE 5

A 0.15 mm-thick, 600 mm-wide roll of copper alloy web (Fe: 0.2%, P: 0.1%, Mn: 0.01%, Sn: 0.5%, Cu: remainder %) was set in an unwinder, and treated in 15% sodium hydroxide at a temperature of 60° C. for 200 seconds by feeding from the unwinder. After washing with water, it was treated with 10% sulfuric acid at a temperature of 60° C. for 20 seconds and washed with water. Then, the surface thereof was grained using a nylon brush and a 400 mesh pumice-water suspension, and washed thoroughly with water. In order to remove the smut generated thereon, the surface was neutralized with 20% nitric acid solution, and rinsed, thereby preparing a substrate. The thus obtained substrate was coated with the following light-sensitive solution, dried, and then wound it into a roll in a length of 2,000 m.

Light-sensitive Solution Composition:

| | |
| --- | --- |
| Ester compound prepared from naphthoquinone-1,2-diazido-5-sulfonyl chloride and pyrogallol-acetate resin | 0.9 g |
| Cresol-formaldehyde resin | 2.0 g |
| t-Butylphenol-formaldehyde resin | 0.05 g |
| Oxazole derivative | 0.03 g |
| "Oil Blue #603" (trade name) | 0.02 g |
| Methyl ethyl ketone | 8 g |
| 2-Methoxyethylacetate | 15 g |

The thus wound roll was cut off at every length of 500 mm, and 1,000 sheets of Samples $A_1$ to $A_{1000}$ were prepared.

Each of these Samples $A_1$ to $A_{1000}$ was used as the lead-frame forming metal plate. An etching pattern image forming film original plate was brought into contact with the light-sensitive layer of each Sample, and the light-sensitive layer was exposed to light and developed to remove the unexposed part thereof. Thereafter, the lead-frame forming plate was dipped in an etching solution of ferric chloride, and the etched part was removed therefrom. Thus, 1,000 sheets of a desired lead-frame were prepared.

Comparative Example 6

Samples were prepared in the same manner as in Comparative Example 1.

The samples prepared in Example 5 ($A_1$ to $A_{1000}$) were compared with the samples prepared in Comparative Example 6 (Comparative Example 1). Therein, it was found that 2 sheets in Samples $A_1$ to $A_{1000}$ were rejected articles, while 83 sheets in the samples prepared in Comparative Example 6 were rejected articles, as described hereinbefore.

As described above, the present invention can solve the problems of quality and productivity which confront the conventional methods of forming lead-frames.

While the invention has been described in detail and with reference to specific embodiments thereof, it will be apparent to one skilled in the art that various changes and modifications can be made therein without departing from the spirit and scope thereof.

What is claimed is:

1. A lead-frame forming material which is prepared by coating a light-sensitive material on both surfaces of a metal web of copper, a copper alloy or a nickel alloy, drying the resulting coated light-sensitive layer to form a coated metal web, and winding the coated metal web into a roll or cutting the coated web into strips of a fixed length and stacking said strips, wherein the light-sensitive material comprises an o-quinonediazide compound and a novolak resin, and wherein the light-sensitive material further contains a water-insoluble but alkaline water-soluble high molecular weight compound containing a —$SO_2$—NH— bond on its side or main chain.

2. A lead-frame forming material which is prepared by coating a light-sensitive material on both surfaces of a metal web of copper, a copper alloy or a nickel alloy, drying the resulting coated light-sensitive layer to form a coated metal web, and winding the coated metal web into a roll or cutting the coated web into strips of a fixed length and stacking said strips, wherein the light-sensitive material comprises an o-quinonediazide compound and a novolak resin, and wherein protrusions having a height of from 0.5 μm to 30 μm are provided on the surface of the light-sensitive layer.

3. A lead-frame forming material which is prepared by coating a light-sensitive material on both surfaces of a material web made of copper, a copper alloy or a nickel alloy, drying the resulting coated light-sensitive layer to form a coated metal web, and winding the coated metal web into a roll or cutting the coated web into strips of a fixed length and stacking said strips, wherein the light-sensitive material is a positive resist composition which comprises:

(1) a water-insoluble but alkaline water-soluble resin, (2) a compound capable of generating an acid by irradiation with active rays or radiant rays, and (3) a compound containing a group decomposable by acid which can increase it solubility in an alkaline developer through the action of the acid; and wherein the light-sensitive material contains a water-insoluble but alkaline water-soluble high molecular weight compound containing a —$SO_2$—NH— bond on its side or main chain.

4. A lead-frame forming material which is prepared by coating a light-sensitive material on both surfaces of a material web made of copper, a copper alloy or a nickel alloy, drying the resulting coated light-sensitive layer to form a coated metal web, and winding the coated metal web into a roll or cutting the coated web into strips of a fixed length and stacking said strips, wherein the light-sensitive material is a positive resist composition which comprises:

(1) a water-insoluble but alkaline water-soluble resin, (2) a compound capable of generating an acid by irradiation with active rays or radiant rays, and (3) a compound containing a group decomposable by acid which can increase it solubility in an alkaline developer through the action of the acid; and wherein protrusions having a height of from 0.5 μm to 30 μm are provided on the surface of the light-sensitive layer.

* * * * *